(12) United States Patent
Bachmann et al.

(10) Patent No.: US 12,272,512 B2
(45) Date of Patent: Apr. 8, 2025

(54) IONIZATION DETECTOR AND DETECTION METHOD

(71) Applicant: KETEK GmbH Halbleiter-und Reinraumtechnik, Munich (DE)

(72) Inventors: Michael Bachmann, Munich (DE); Andreas Schels, Munich (DE); Florian Herdl, Kiefersfelden (DE); Stefan Zimmermann, Burgwedel (DE); Simon Edler, Munich (DE); Erik Bunert, Langenhagen (DE)

(73) Assignee: KETEK GmbH Halbleiter-und Reinraumtechnik, Munich (DE)

( * ) Notice: Subject to any disclaimer, the term of this patent is extended or adjusted under 35 U.S.C. 154(b) by 0 days.

(21) Appl. No.: 18/316,194

(22) Filed: May 11, 2023

(65) Prior Publication Data

US 2023/0369001 A1 Nov. 16, 2023

(30) Foreign Application Priority Data

May 12, 2022 (DE) .......................... 102022111959.9

(51) Int. Cl.
*H01J 1/312* (2006.01)
*C23C 16/26* (2006.01)
*C23C 16/34* (2006.01)
*H01L 21/02* (2006.01)

(52) U.S. Cl.
CPC .............. *H01J 1/312* (2013.01); *C23C 16/26* (2013.01); *C23C 16/342* (2013.01); *H01J 2201/3125* (2013.01); *H01L 21/02527* (2013.01)

(58) Field of Classification Search
CPC .............. H01J 1/312; H01J 2201/3125; H01L 21/02527; C23C 16/26; C23C 16/342
See application file for complete search history.

(56) References Cited

U.S. PATENT DOCUMENTS

| 2005/0077897 A1 | 4/2005 | Syms |
| 2011/0049347 A1 | 3/2011 | Wells |
| 2020/0393409 A1* | 12/2020 | Hirakawa ............ G01N 27/622 |

(Continued)

FOREIGN PATENT DOCUMENTS

| DE | 112010003411 B4 | 5/2015 |
| JP | 2017045639 A | 3/2017 |

(Continued)

OTHER PUBLICATIONS

Murakami, K., et al., "Electron emission properties of graphene-oxidesemiconductor planar-type electron emission devices," J. Vac. Sci. Technol. B 36(2), https://doi.org/10.1116/1.5006866, Feb. 27, 2018, 6 pages.

(Continued)

*Primary Examiner* — Anne M Hines
(74) *Attorney, Agent, or Firm* — Slater Matsil, LLP

(57) ABSTRACT

In an embodiment an ionization detector includes a gate-insulator-substrate electron-emission structure (GIS-EE) configured to emit low-energy electrons, a sample chamber configured for at least one gas to be detected, the sample chamber being adjacent to the GIS-EE and a measuring unit configured to detect and/or select charged particles, wherein the charged particles are due to the emitted electrons and/or comprise the emitted electrons.

19 Claims, 8 Drawing Sheets

(56) References Cited

U.S. PATENT DOCUMENTS

| | | | |
|---|---|---|---|
| 2022/0216026 A1 | 7/2022 | Murakami et al. | |
| 2023/0134647 A1 | 5/2023 | Murakami et al. | |

FOREIGN PATENT DOCUMENTS

| | | | |
|---|---|---|---|
| JP | 2019071260 A | 5/2019 | |
| JP | 2020184453 A | 11/2020 | |
| JP | 2021150246 A | 9/2021 | |
| PL | 228498 B1 | 5/2014 | |
| WO | 2020022599 A1 | 1/2020 | |
| WO | 2021193237 A1 | 9/2021 | |

OTHER PUBLICATIONS

Murakami, K., et al., "Graphene-oxide-semiconductor planar-type electron emission device," Appl. Phys. Lett. 108, 083506 (2016), https://doi.org/10.1063/1.4942885, Feb. 26, 2016, 5 pages.

Murakami, K., et al., "Highly Monochromatic Electron Emission from Graphene/Hexagonal Boron Nitride/Si Heterostructure," ACS Appl. Mater. Interfaces 2020, 12, 3, 4061-4067, https://doi.org/10.1021/acsami.9b17468, Dec. 27, 2019, 12 pages.

Murakami, K., et al., "High-performance planar-type electron source based on a graphene-oxide-semiconductor structure," Appl. Phys. Lett. 114, 213501 (2019), https://doi.org/10.1063/1.5091585, May 30, 2019, 6 pages.

Murakami, K., et al., "Mechanism of Highly Efficient Electron Emission from a Graphene/Oxide/Semiconductor Structure," ACS Appl. Electron. Mater. 2020, 2, 7, 2265-2273, https://doi.org/10.1021/acsaelm.0c00449, Jul. 6, 2020, 13 pages.

\* cited by examiner

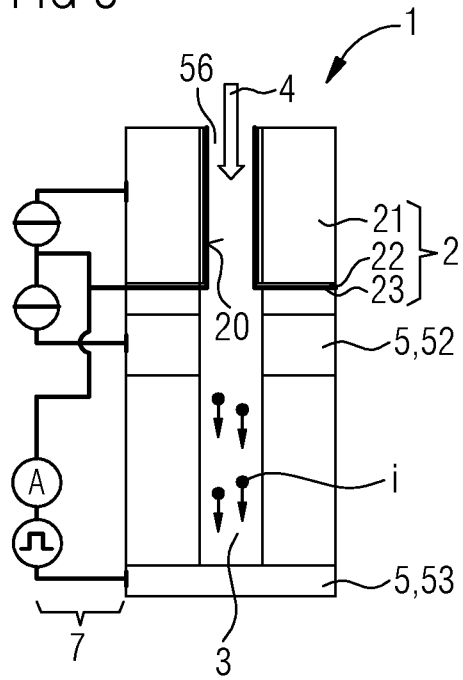
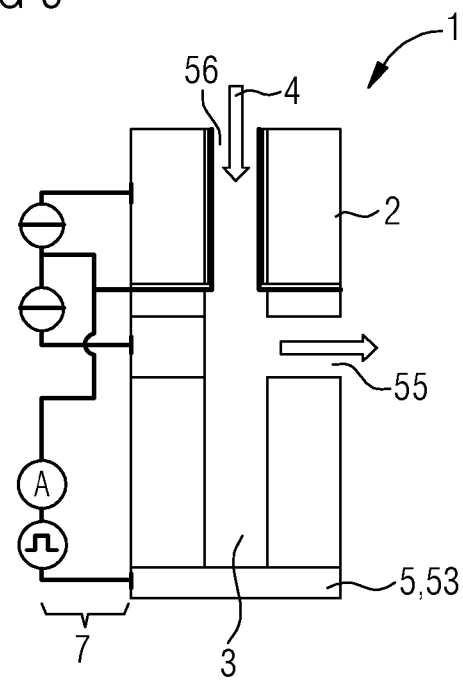
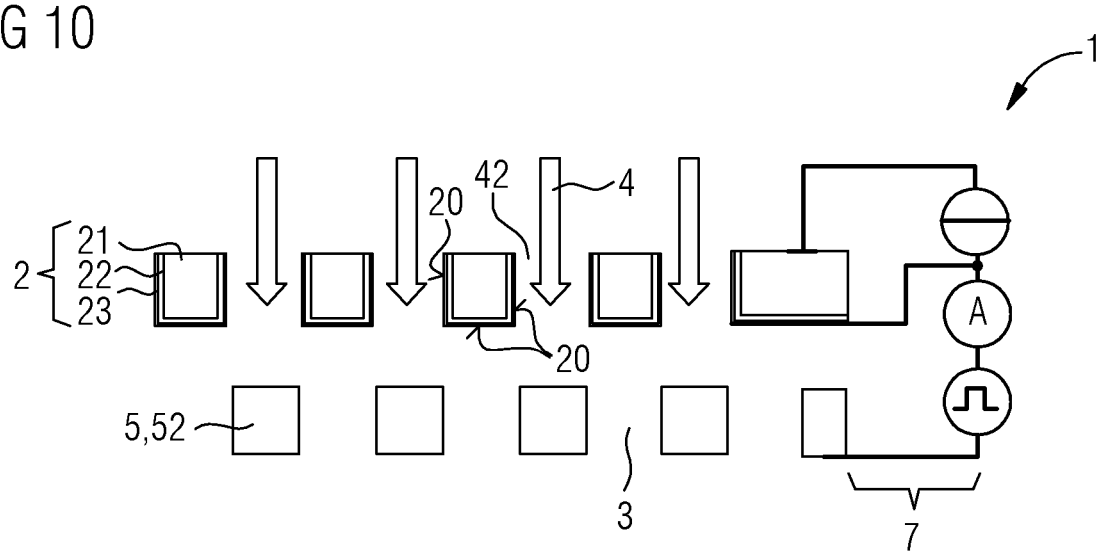

IONIZATION DETECTOR AND DETECTION METHOD

CROSS-REFERENCE TO RELATED APPLICATIONS

This application claims the benefit of German Application No. 102022111959.9, filed on May 12, 2022, which application is hereby incorporated herein by reference.

TECHNICAL FIELD

An ionization detector is specified. Furthermore, a detection method for such an ionization detector is specified.

BACKGROUND

International Patent Applications WO 2020/022599 A1 and WO 2021/193237 A1 concern electron emitters with a substrate, an insulating layer and a gate electrode.

Polish Patent Application PL 228 498 B1 refers to a micro-ion getter pump.

SUMMARY

Embodiments provide an ionization detector that is reliable and space-saving.

According to at least one embodiment, the ionization detector comprises one or more gate-insulator-substrate electron-emission structures, or GIS-EEs. The at least one GIS-EE is configured to emit low-energy electrons during operation. In particular, the term insulator means that a material of the layer in question has a large band gap, relative to the adjacent electrode layers, so that, in addition to dielectric materials, semiconducting materials can in principle also be considered for the insulator. With regard to the GIS-EE, reference is also made to International Application WO 2020/022599 A1 and WO 2021/193237 A1, the disclosure content of which with regard to the GIS-EE is incorporated herein by reference.

For example, the GIS-EE sequentially comprises a substrate, an insulator layer, and a gate electrode. The insulator layer may also be referred to as a transfer layer. For example, a voltage applied to the gate electrode causes a tunneling current into the conduction band of the insulator layer. The thicknesses of the gate electrode and the insulator layer, as well as a choice of material, are made, for example, in such a way that scattering of electrons is minimized. The thickness of the insulator layer and the gate electrode in particular should be as thin as possible, and the material and combination of materials should generally cause little scattering. For example, graphene or pyrolytic carbon and similar materials for the gate electrode exhibit very low electron scattering. Furthermore, compared to a metal, a combination with silicon or silicon oxide is expected to have a lower energy difference of the conduction band edge and thus a lower quantum mechanical reflection.

By minimizing the scattering, the electrons can thus absorb energy in the field and partially perform the work function and emerge from the gate electrode. This means that a kind of integrated thermal emitter can be realized, in which the electron gas is heated directly. An advantage is that in this case no vacuum outside the electron source is needed for operation and the energy of the electrons can be varied by the applied voltage between the gate electrode and the substrate.

However, other electron sources, such as vacuum-encapsulated electron sources with electron transmission windows, can be used instead of a GIS-EE in the same way.

In operation, the GIS-EE could also be heated, on the one hand to avoid condensation of molecules to be analyzed and/or, on the other hand, to increase the emission current and/or reduce the load on the insulator by thermally heating the electron gas.

According to at least one embodiment, the ionization detector comprises one or more sample chambers. The at least one sample chamber is configured for at least one gas to be detected. That is, the at least one sample chamber can be provided with the at least one gas to be detected. The corresponding gas can be directed into or through the at least one sample chamber, for example, in a continuous flow mode or also in a pulsed mode.

The term gas to be detected includes here and in the following gas mixtures and optionally also liquids or liquid mixtures.

According to at least one embodiment, the at least one sample chamber is adjacent to the at least one GIS-EE. That is, the sample chamber and the GIS-EE may be in touch.

According to at least one embodiment, the ionization detector comprises one or more measuring units. The at least one measuring unit is arranged for a detection and/or for a selection of charged particles. The charged particles originate from the emitted electrons, such as ions generated directly or indirectly by the emitted electrons, or the charged particles comprise the emitted electrons, or the charged particles are at least a part of the emitted electrons.

In at least one embodiment, the ionization detector comprises:
- a gate-insulator-substrate electron-emission structure, GIS-EE, which is configured to emit low-energy electrons,
- a sample chamber which is configured for at least one fluid mixture to be detected, in particular gas, and which is preferably directly adjacent to the GIS-EE, and
- a measuring unit which is configured for a detection and/or a selection of charged particles, the charged particles originating from the emitted electrons and/or at least partially comprising the emitted electrons.

In particular, the use of the GIS-EE allows the ionization detector to be configured in a space-saving and cost-effective manner. In addition, the use of the GIS-EE can enable the ionization detector to be used efficiently, since, for example, measures for radiation protection, as otherwise necessary when using a radioactive $^{63}$Ni foil as electron source, can be omitted. In addition, the GIS-EE can be energetically tuned as well as pulsed to enable new detection techniques.

According to at least one embodiment, the GIS-EE is configured to emit the electrons with a kinetic energy of 0 eV or more, after subtraction of the performed work function, in particular to emit them into the gas to be detected. Alternatively or additionally, this energy is at most 100 eV or at most 50 eV or at most 20 eV.

$\overline{E}_e = V_{SG} * e - \overline{E}_{verl.} - W_A$ The energy of the electrons can be calculated, for example, with the following equation A):

$$\overline{E}_e = V_{SG} * e - \overline{E}_{verl.} - W_A$$

where "$\overline{E}_e$" is the average energy of the emitted electrons, "$V_{SG}$" the applied potential difference between the substrate and the gate electrode of the GIS-EE, "e" the elementary charge, "$E_{verl.}$" the average energy loss due to scattering in the GIS-EE, and "$W_A$" the work function of the gate electrode.

According to at least one embodiment, the GIS-EE comprises an electrically conductive substrate. The substrate may be the component mechanically supporting and sustaining the GIS-EE. It is possible for the substrate to be mechanically rigid so that the GIS-EE does not deform in the intended use. Alternatively, the substrate can be mechanically flexible and designed as a film.

It is possible for an electrically conductive layer together with a carrier to take the place of the electrically conductive substrate. Such an electrically conductive layer can then be attached to the carrier, whereby the carrier mechanically assumes the role of the substrate and need not be electrically conductive.

The substrate can also be referred to as the substrate electrode.

According to at least one embodiment, the GIS-EE comprises a transfer layer of a material having a bandgap that is larger than the bandgap of the substrate or the electrically conductive layer. For example, the band gap of the material of the transfer layer is at least 2 eV or at least 3 eV or at least 4 eV or at least 5 eV. The transfer layer may be an insulating layer of a dielectric material. The transfer layer is preferably disposed directly on the electrically conductive substrate or, alternatively, directly on the electrically conductive layer.

According to at least one embodiment, the GIS-EE comprises a gate electrode made of a further electrically conductive material. The further electrically conductive material may differ from the material of the electrically conductive substrate or the electrically conductive layer, or it may also be the same material. In particular, the gate electrode is attached directly to a side of the transfer layer facing away from the electrically conductive substrate or the electrically conductive layer.

According to at least one embodiment, the GIS-EE comprises at least one first electrical connection structure. The first electrical connection structure serves to electrically connect the electrically conductive substrate or the electrically conductive layer. The first electrical connection structure may be, for example, a metallic electrical lead.

According to at least one embodiment, the GIS-EE comprises at least one second electrical connection structure. The second electrical connection structure is used to electrically connect the gate electrode. The second electrical connection structure can be, for example, a metallic electrical lead. It is possible for the second electrical connection structure to extend over the entire surface of the gate electrode, for example, in the form of a grid or in the form of strips, or for the gate electrode to be contacted by the second electrical connection structure only at points at one or more electrical connection points.

According to at least one embodiment, the gate electrode comprises carbon or consists of carbon. For example, the gate electrode is then a graphene layer or a graphite layer.

According to at least one embodiment, the gate electrode is thin. For example, a thickness of the gate electrode is then at least one atomic layer or at least 1 nm. Alternatively or additionally, this thickness is at most 15 nm or at most 10 nm or at most 5 nm.

According to at least one embodiment, the GIS-EE comprises a plurality of lamellae each configured to emit the electrons. Alternatively, a plurality of the GIS-EE is provided, each of which is configured as lamellae. These lamellae can also be realized on a substrate by a surface structure, for example, as etched trenches in silicon. Lamella means, for example, that the corresponding structure is to be regarded as two-dimensional, so that in particular a length and/or a width of the corresponding structure are greater than a thickness of the corresponding structure by at least a factor of 10 or by at least a factor of 20.

According to at least one embodiment, each of the lamellae comprises a sub-area of the gate electrode. The sub-regions and thus the lamellae taken together can then form the gate electrode. It is possible that these sub-regions are aligned parallel to each other and/or each adjoin the sample chamber.

According to at least one embodiment, the GIS-EE has a plurality of holes extending there-through. That is, the GIS-EE then comprises the holes and the holes extend completely through the GIS-EE. In particular, the holes extend straight through the GIS-EE.

According to at least one embodiment, the sample chamber comprises the holes. In other words, the holes are part of the sample chamber or form the complete sample chamber.

According to at least one embodiment, the sample chamber is partially or completely radially surrounded by the at least one GIS-EE. For example, the GIS-EE is then formed as a cylinder jacket or cone jacket or as part of a cylinder jacket or cone jacket around the sample chamber. Fluid openings, such as gas inlet openings and/or gas outlet openings, may extend through the at least one GIS-EE.

Alternatively, the at least one GIS-EE is located on only one side of the sample chamber. This applies in particular if the at least one GIS-EE is plate-shaped or is composed of several lamellae arranged in a common plane.

According to at least one embodiment, the ionization detector is an electron capture detector or comprises an electron capture detector. In this case, the measurement unit preferably comprises one or more electron capture devices. The at least one electron capture device, which is in particular an electron detector, may face an emission side of the GIS-EE. For example, the at least one electron capture device is an anode, such as an anode plate or grid or rod. The electron capture device may be an electron detector, or it may be an electrode array of a detector, such as the drift tube of an IMS or a TOF detector, where TOF stands for time-of-flight.

According to at least one embodiment, the measuring unit, in particular the at least one electron capture device, is configured to generate an electric field between the emission side and the electron capture device. This electric field may be static or dynamic.

According to at least one embodiment, the sample chamber is arranged to allow the fluid mixture, in particular gas, to be detected to flow through between the emission side and the at least one electron capture device. For this purpose, the ionization detector or the measuring unit may include a pump for the gas to be detected. A resulting gas flow may be steady or pulsed. In the case that the ionization detector is a combination detector, it may be provided that the gas further flows through the at least one electron capture device, for example, to guide ions to a further detector element.

According to at least one embodiment, the ionization detector is an electron ionization detector or comprises an electron ionization detector.

According to at least one embodiment, the at least one GIS-EE is configured to vary an energy of the emitted electrons. This is done, for example, by varying a voltage across the GIS-EE, in particular according to equation A).

According to at least one embodiment, differently constructed GIS-EEs are present. The different GIS-EEs differ, for example, with respect to the thickness of the insulator layer. Insulator layers with different thicknesses enable, in particular, the application of different voltages between the substrate and the gate electrode, so that different energy ranges can be accessible for the emitted electrons.

According to at least one embodiment, the at least one GIS-EE comprises emission areas with associated insulator layers of different thicknesses, which can be operated with different gate voltages both temporally and spatially staggered. This makes it possible to keep the applied field, which determines the tunnel current and thus the emission current, constant according to the following equation B), while different voltages at the areas with insulator layers of different thicknesses change the electron energy according to equation A):

$$B) \quad F = \frac{V_{SG}}{d_{Isol.}};$$

where "F" is the electric field applied across the isolator layer, "$V_{SG}$" the potential difference between the substrate and the gate electrode, and "$d_{Isol.}$" the thickness of the insulating layer.

According to at least one embodiment, the at least one GIS-EE is configured to adjust the energy of the emitted electrons by a further layer stack consisting of or comprising a further insulator layer and an energy control electrode on the GIS-EE. The same applies to the further insulator layer as to the transfer layer with respect to materials and thickness.

In this case, the potential set on the additional energy control electrode adjusts the energy of the emitted electrons, in particular, according to the following equation C):

$$\overline{E}_e = V_{SESE} * e - \overline{E}_{verl.2} - W_A; \qquad \text{C)}$$

where "$\overline{E}e$" is the average energy of the emitted electrons, "$V_{SESE}$" the applied potential difference between the substrate and the energy control electrode of the GIS-EE, "e" the elementary charge, "$\overline{E}_{verl.2}$" the average energy loss due to scattering in the GIS-EE and the additional layer stack, and "$W_A$" the work function of the energy-control electrode. That is, the additional stack increases the average energy loss, but the total energy can then be adjusted independently of the emission current by the additional potential.

According to at least one embodiment, the at least one GIS-EE is configured to be used as an electron impact ionization source with tunable energy of the emitted electrons. In this case, the energy distribution of the emitted electrons at half height of their maximum, FWHM, has, for example, a width of at most 0.3 eV, in order to selectively ionize, for example, nitrogen with an ionization energy $E_{Ion,N2}$=15.6 eV but not yet argon with an ionization energy of $E_{Ion,Ar}$=15.8 eV, or a maximum of 3 eV to selectively ionize oxygen with an ionization energy $E_{Ion,O2}$=12.1 eV but not yet $CO_2$ with an ionization energy of $E_{Ion,CO2}$=13.8 eV, or at most 5 eV or at most 10 eV, where $E_{Ion}$ in each case is the first ionization energy of the respective molecule or atom.

According to at least one embodiment, the measuring unit is configured to detect a number of emitted electrons transmitted through the fluid mixture to be detected, in particular gas, depending on the energy of the emitted electrons. This means that the composition of the gas can be inferred by means of the number of transmitted electrons.

According to at least one embodiment, the ionization detector comprises a diffusion detector or is a diffusion detector. This may mean that the ionization detector is configured to determine a diffusion constant of the gas to be detected.

According to at least one embodiment, the ionization detector comprises or is a time-of-flight detector, also referred to as TOF detector. This may mean that the ionization detector is configured to determine a time-of-flight of generated ions.

According to at least one embodiment, the ionization detector is or comprises an ion mobility spectrometer, IMS for short.

According to at least one embodiment, the ionization detector comprises or is a mass spectrometer. In particular, the measurement unit includes the mass spectrometer, which is preferably downstream of the at least one GIS-EE. However, as mentioned above and as is correspondingly possible in all other embodiments, the electron source need not be a GIS-EE, but can also be realized differently, for example, as a vacuum-encapsulated arrangement of a heating wire and accelerating electrodes.

In particular, the ionization detector then additionally comprises at least one ion detector and/or a detector that is configured to select and/or to detect the ions according to their mass, for example, via acceleration in an electric and/or magnetic field.

According to at least one embodiment, the measuring unit comprises one or more accelerating electrodes. The at least one accelerating electrode is configured to accelerate the charged particles, in particular ions, for example, in an electric or magnetic field. The ions can then be detected by the ion detector.

In addition, a detection method for an ionization detector as described in connection with one or more of the above embodiments is disclosed. Features of the ionization detector are therefore also disclosed for the detection method, and vice versa.

In at least one embodiment, the detection method comprises the following steps, for example, in the order indicated:

operating the at least one electron source, such as the GIS-EE, so that the low-energy electrons are emitted, guiding the at least one fluid mixture to be detected, in particular gas, into the sample chamber, and detecting and/or selecting the charged particles by means of the measuring unit.

BRIEF DESCRIPTION OF THE DRAWINGS

In the following, an ionization detector described herein and a detection method described herein are explained in more detail with reference to the drawing on the basis of exemplary embodiments. Identical reference signs indicate the same elements in the individual figures. However, no references to scale are shown, rather individual elements may be shown exaggeratedly large for better understanding.

FIGS. 4 through 10 show schematic cross-sectional views of detection methods according to embodiments of ionization detectors;

DETAILED DESCRIPTION OF ILLUSTRATIVE EMBODIMENTS

Figure 1:
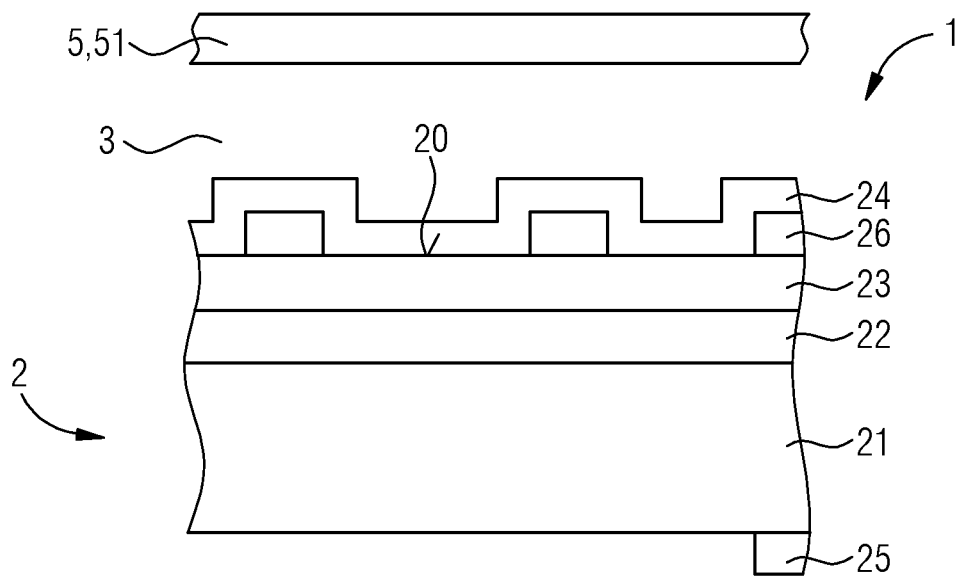
FIG. 1 shows a schematic sectional according to an embodiment of an ionization detector.

FIG. 1 shows an example of an ionization detector 1. The ionization detector 1 includes a gate-insulator-substrate electron-emission structure 2, or GIS-EE for short. The GIS-EE 2 includes an electrically conductive substrate 21, which may be replaced by a combination of a substrate and an electrically conductive layer, not drawn. Further, the GIS-EE 2 includes a transfer layer on the substrate 21, such as an insulator layer 22 made of a dielectric material, and a gate electrode 23 on the insulator layer 22. For electrical contacting, first and second electrical connection structures 25, 26 are optionally provided. Instead of the dielectric material, the transfer layer can also be of a material with a large band gap, such as SiC, GaN, AlN, $Ga_2O_3$ or diamond, as also possible in all other examples.

It is possible that the second electrical connection structure 26 is applied to the gate electrode 23 as a grid or structured in strips to provide a more uniform voltage across the gate electrode 23.

Further, it is possible that a protective layer 24 is present covering the gate electrode 23. Optionally, portions of the second electrical connection structure 26 extending over the gate electrode 23 are located between the gate electrode 23 and the protective layer 24.

The ionization detector 1 further comprises a measuring unit 5, which is shown in FIG. 1 only in a highly simplified manner, in particular without any associated electronics. For example, the measuring unit 5 comprises an electron capture device, such as an electron detector 51, which may be configured as an anode plate and which may face an emission side 20 of the GIS-EE 2. Between the measuring unit 5 and the GIS-EE 2 there is a sample chamber 3, which is configured to be flowed through by at least one gas 4 to be detected, not drawn in FIG. 1. The term 'gas to be detected' also includes gas mixtures and can also include liquid mixtures as an alternative or in addition to a gas mixture.

The application of ion mobility spectrometers as well as electron capture detectors is hampered by the associated radiation protection requirements due to the usually necessary use of radioactive ion sources. In addition, ion mobility spectrometers in particular can detect very low concentrations of substances, but often do not achieve sufficiently low cross-sensitivities.

Therefore, one idea of the present application is to realize detectors based on a GIS-EE. For this purpose, the electron gas in a conductor-insulator-conductor structure, such as the GIS-EE, is heated to a few eV by a very high local electric field in order to be able to perform the work function in the gate electrode and thus obtain free electrons. Thermalization of the electrons by scattering can thus be avoided or at least reduced by small thicknesses of the layers 22, 23.

Field emission allows electrons to tunnel into the conduction band of the insulator layer 22. If there is a sufficient voltage drop and low scattering probability, these hot electrons can be emitted through the gate electrode 23 into the sample chamber 3. The energy that can be achieved is limited by the dielectric strength and/or by the lifetime of the insulator layer 22. As the voltage increases, for a given thickness of the insulator layer 22, the tunneling current increases and consequently the stress increases and thus the lifetime decreases. To a certain extent, the thickness of the insulator layer 22 can be increased to reduce the tunnel current at a given voltage, but in doing so, stray effects increase, decreasing efficiency. Similarly, the maximum charge transported by the tunneling process before a breakdown can decrease with increasing thickness.

An energy range for the emitted electrons of, for example, up to 50 eV is possible. In this type of electron emitter, the actual tunnel barrier is the interface between the insulator layer 22 and the substrate 21, which is thus not exposed to the influence of the environment. This principle thus works not only in vacuum but also at atmospheric pressure as well as in liquids, making an evacuated package superfluous. Since the electron energy can be adjusted in a certain range, see equation A), via the voltage as well as, see equation B), for a constant field via the thickness of the insulator layer 22, an electron source with variable electron energy can thus be realized, if necessary also by a plurality of GIS-EEs 2 with different thicknesses of the insulator layer 22, for example, on the common substrate 21. Alternatively, another gate insulator stack could be used to vary, according to equation C), the energy of the emitted electrons independently of the emission current.

In order to achieve the lowest possible scattering in the gate electrode 23 and at the interface to the insulator layer 22, the gate electrode 23 should be made as thin as possible on the one hand. For example, a thickness of the gate electrode 23 is in the range of the wavelength of the electrons, that is, at most 20 nm. In addition, the gate electrode 23 should have a small energy difference of the conduction band edge to the conduction band edge of the insulator layer 22 in order to minimize quantum mechanical reflection.

Due to the requirement of the small layer thickness, the conductivity of a material of the gate electrode 23 is also preferably selected to be as high as possible in order to realize a low voltage drop across the gate electrode 23 and thus the possibility of the largest possible active areas.

One possibility is carbon-based gate electrodes 23. Here, on the one hand, a diamond or diamond-like, that is, $sp^3$ hybridized dominated, as well as a graphite-like, that is, $sp^2$ hybridized dominated, design of the gate electrode 23 can be considered. Carbon materials in both forms exhibit very high, possibly direction-dependent electrical conductivities, as well as very high electron transmission. This is particularly true for graphene.

A semiconductor-based gate electrode 23 can also provide a small energy jump to the insulator conduction band. For example, with a silicon oxide as the insulator layer 22, silicon can also be considered as the material for the gate electrode 23.

Metals, in particularly thin layers, can also be considered for the gate electrode 23. In particular, metal layers produced by atomic layer deposition, ALD for short, can be homogeneous and very thin.

Examples of $sp^2$ hybridized dominated carbon based materials for the gate electrode 23 include: graphene, multilayer graphene, two-layer graphene, three-layer graphene, exfoliated graphene. Materials of the graphene family can be grown and then transferred in particular catalytically, for example, using copper. The growth can be done, for example, on $SiO_2$, SiC, metals such as copper, hexagonal boron nitride or sapphire. Likewise, graphene can be grown directly on the insulator layer 22 without subsequent transfer, for example, on hexagonal boron nitride. Furthermore, solid phase graphene growth, such as HOPG (Highly Oriented Pyrolytic Graphite) with subsequent transfer can be relied upon. Furthermore, the use of nanocrystalline graphene, pyrolytic graphene, pyrolytic carbon, graphitic carbon or graphenic carbon is possible. Possible production methods are chemical vapor deposition, CVD for short, such as APCVD (Atmospheric Pressure CVD), LPCVD (Low Pressure CVD), PECVD (Plasma-enhanced CVD) or ECVD (Electro CVD); furthermore, physical vapor deposition, PVD for short, as well as transfer methods. So-called glassy carbon or pyrolyzed polymer films can be produced by pyrolysis.

Examples of $sp^3$ hybridized dominated carbon based materials for the gate electrode 23 are: diamond, diamond like carbon, abbreviated DLC, ultra-nanocrystalline diamond, abbreviated UNCD, which can be doped and can be produced, for example, by CVD, such as PECVD.

Other two dimensional, 2D, materials are also conceivable, such as borophene, phosphors, or even transition metal dichalcogenides.

Examples of semiconductor materials for the gate electrode 23 include: crystalline Si, poly-Si, amorphous Si, Ge, which can be produced by CVD, such as LPCVD.

Examples of metals for the gate electrode 23 are: Al, Au, Ag, Pt, Ni, Co, which are, for example, producible by ALD.

For example, the gate electrode 23 has a specific conductance of $10^{-1}$ S/m to 109 S/m. For example, a thickness of the gate electrode 23 is at least one monolayer and at most 20 nm or at most 10 nm.

Above all, the insulator 22 should be selected to be as robust as possible against the tunnel currents used, in order to enable the highest possible current density and service life of the GIS-EE 2. A manufacturing process in which the thickness of the insulator layer 22 can be precisely controlled is preferable in order to achieve very thin homogeneous layers 22 and a high homogeneity of emission.

For example, the insulator 22 is made of silicon dioxide, since the achievable high oxide quality as well as the relatively precisely adjustable thickness allow a high current density and thus service life. Especially in combination with a silicon substrate 21, established manufacturing processes are also available. In addition, the insulator 22 can be hexagonal boron nitride, or hBN for short, which allows, among other things, direct epitaxial growth of graphene on its surface. Since the thickness can also be very well controlled by various fabrication methods, hBN is an interesting option for the insulator 22. Especially in combination with hBN as insulator layer 22 and graphene as gate electrode 23, very low-scattering tunneling processes and thus a sharp energy distribution of the emitted electrons can be realized here. The high-k dielectrics used in CMOS technology can also be considered for the insulator 22. Especially fabrication methods like ALD are able to achieve very homogeneous layers with a relatively high quality.

Silicon dioxide for the insulator 22 can be generated, for example, thermally, in particular wet, dry, at room temperature or in an oxidation furnace, or by CVD or by vapor deposition. hBN or BN can be generated, for example, by PECVD and annealing, LPCVD, catalytic growth and transfer. High-k dielectrics such as $Al_2O_3$ or HfO can be produced by evaporation, sputtering or ALD.

For example, the insulator layer 22 has a dielectric strength of 0.1 V/nm to 500 V/nm.

With silicon as the material for the substrate 21, also referred to as the substrate electrode, common methods from the CMOS industry are available and scalable, reproducible manufacturing is achievable. By varying the doping, the electrical properties can be influenced and even a voltage drop at the gate electrode can be compensated for by a suitable doping profile. Silicon also offers the possibility of integrating further functionality on a chip.

Furthermore, for the substrate 21 Highly Oriented Pyrolytic Graphite, or HOPG for short, is possible as a highly conductive, flexible material and can provide a very good substitute for common radioactive foils, such as Ni-63, as an electron source or as an ionization source.

Sapphire, hBN, silicon carbide or even a metal or metal film are also possible for the substrate 21. In the case of a non-conductive substrate layer, conductivity can be realized by an additional layer. For example, graphene can be grown directly on its surface.

The substrate electrode 21 can thus be silicon, with a possible doping of either p or n and a doping level of -- to ++, with P, As, Sb, B, Al, Ga and/or In as possible dopants. Furthermore, HOPG and graphite foils as well as sapphire wafers, possibly with a carbon layer, and SiC, possibly with a carbon layer, can also be used, as well as metal films.

For example, a thickness of the substrate 21 is at least one monolayer and/or at most 5 mm. The substrate 21 may be mechanically rigid or flexible. For example, a specific electrical conductivity of the substrate 21 is between $10^{-1}$ S/m and 109 S/m, inclusive.

Since the detector 1 may be used in air with oxygen or under aggressive environment, the protective layer 24 for the gate electrode 23 may also be necessary. Here, the chemical resistance of the protective layer 23 as well as the controlled, homogeneous deposition of even very small thicknesses is particularly important. Here again, gate dielectric manufacturing processes as well as ALD are of particular interest.

For example, the protective layer 24 can be made of silicon dioxide, as is possible for the insulator 22. In addition, the protective layer 24 can be made of hBN or BN, which allows very thin layers and is a suitable material especially in combination with graphite or graphene layers for the gate electrode 23 due to the epitaxial process. Here, in particular, the same lattice structure as for graphitic carbon would also be advantageous. Furthermore, the protective layer 24 can be glassy carbon, and especially through ALD processes, high-k dielectrics are again possible. Silicon as well as silicon carbide or silicon nitride are also possible materials for the protective layer 24, as well as $Al_2O_3$, for example, produced by high frequency sputtering processes or reactive sputtering processes or ALD.

The protective layer 24 is preferably chemically insensitive to, for example, oxygen ions and oxygen radicals. A thickness of the protective layer 24 is, for example, at least one monolayer and/or at most 10 nm.

For example, a current density of the GIS-EE 2 is at most 100 $A/cm^2$, an emission electrode voltage may be between 0.5 V and 50 V, inclusive, and an efficiency may be up to 99% or 95% or 90%.

A functionality of the GIS-EE 2 for ionization can be independent of pressure and type of gas or liquid in which the GIS-EE 2 is operated.

The ionization detector 1 described here is thus based on the GIS-EE 2 as an electron source, with emission based on hot electrons. Possible detector principles are, as explained in more detail below, in each case pulsed or in continuous wave operation: electron capture detector, ECD for short, electron photoionization detector, ePID for short, ion mobility spectrometer, IMS for short, differential ion mobility spectrometer, DMS for short, high kinetic energy ion mobility spectrometer, HIKE-IMS for short, field asymmetric ion mobility spectrometer, FAIMS for short, or aspiration ion mobility spectrometer, A-IMS for short, diffusion detector, combination detectors, such as ePID and drift tube or such as ePID and diffusion detector.

The ionization detector 1 can be constructed like a plate capacitor or like a cylinder capacitor, whereby openings or grid arrangements of the GIS-EE 2 and/or the measuring unit 5 are also possible and gas flows from all sides are conceivable.

Figure 2:
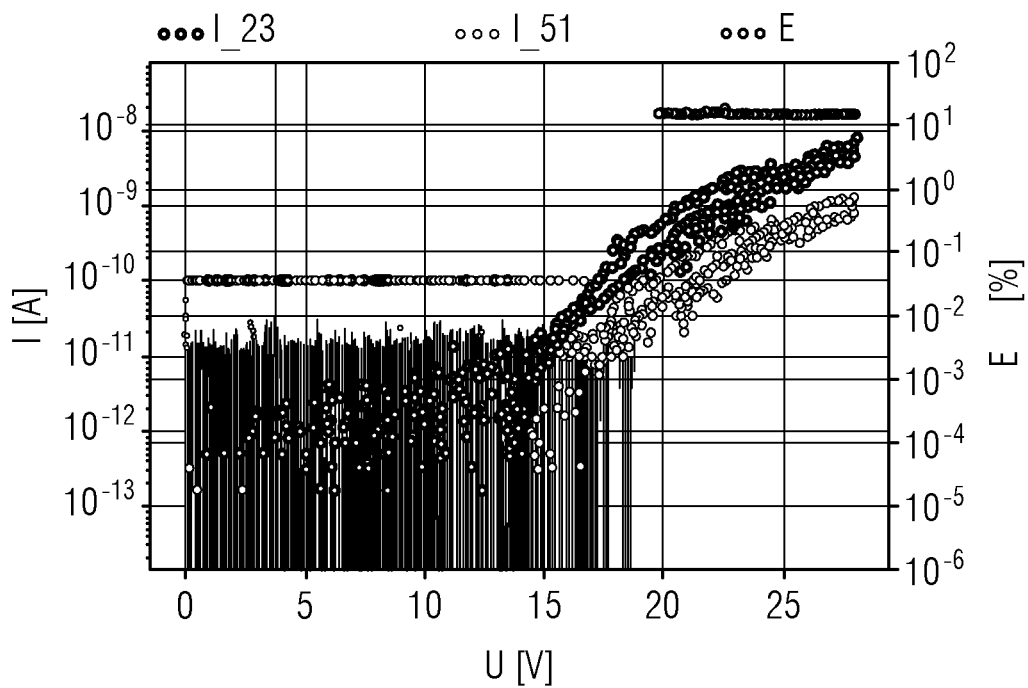
FIGS. 2 and 3 show schematic illustrations of emission characteristics of gate-insulator-substrate electron-emission structures according to embodiments of ionization detectors.

FIG. 2 shows a current-voltage, IU, characteristic of a GIS-EE 2 with a graphene-silica-silicon structure. Here, the substrate 21 is a silicon substrate with an active area of 300 µm×300 µm. The insulator layer 22 is a 22 nm thick layer of silicon dioxide, onto which a monolayer of graphene has been transferred.

The current I_23 is drawn, which was measured in the graphene electrode 23. This current corresponds to the portion of the total current not emitted as free electrons. The anode current I_51 was measured through an anode 30 µm away with a voltage of 40 V relative to the gate electrode 23, applied through a mica foil as insulator. The residual gas pressure was i0-3 mbar. The efficiency E shown is the quotient of the anode current I_51 by the total current, which is given by the sum of the anode current I_51 and the graphene current I_23. An emission current of about 1 nA is achieved with an efficiency E of about 20%.

Figure 3:
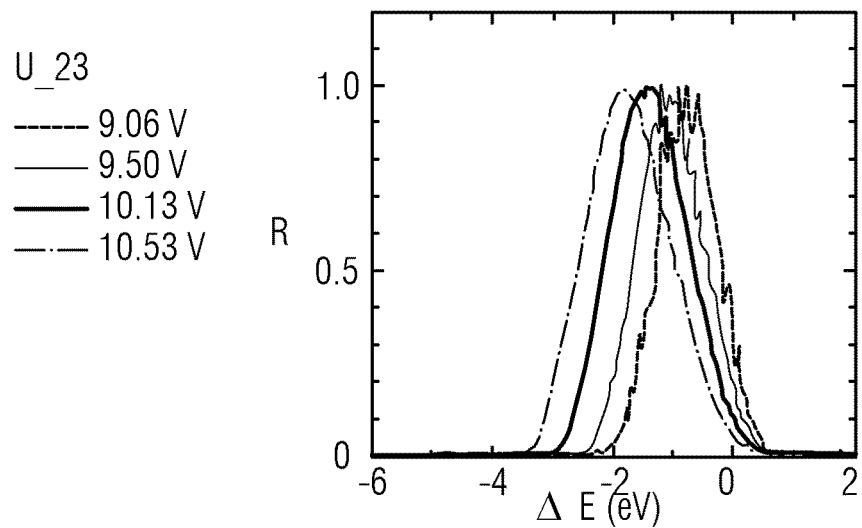

FIG. 3 shows an energy spectrum of a graphene-oxide-silicon structure operated with a variable voltage and thus a variable energy ΔE, normalized to a relative intensity R of 1. By varying the voltage U_23 between the substrate and the gate electrode 23, the energy of the electrons can be tuned.

If a structure consisting of graphene 23, hexagonal boron nitride, hBN, as insulator 22 and silicon substrate 21 is used for the GIS-EE 2, scattering of the electrons in the insulator 22 can be minimized by the hBN, resulting in narrow emission spectra and lower energy loss compared to a structure with silicon oxide as insulator 22. In this case, the energy distribution of the emitted electrons at half height of a maximum, FWHM, has a width of, for example, at most 0.3 eV or at most 3 eV or at most 5 eV or at most 10 eV. Thus, with a suitable choice of electron energy, nitrogen can be selectively ionized, for example, but not argon, or oxygen can be selectively ionized, for example, but not $CO_2$.

FIGS. 4 to 7 show ionization detectors 1 designed as electron capture detectors, also referred to as ECD for short. In ECD, the molecule-specific probability of electron capture of low-energy electrons is measured. In a common setup, this is done by exploiting the fact that light electrons e in an electric field F, unlike massive ions, follow the electric field F rather than a gas flow, allowing them to be read out. When electrons are captured by a gaseous analyte A in the gas 4 under investigation, they are absent in the volume, which reduces a measured electron flow I (t) in the course of time t, starting with the presence of the analyte A, and is used as a measurement effect.

Figure 4:
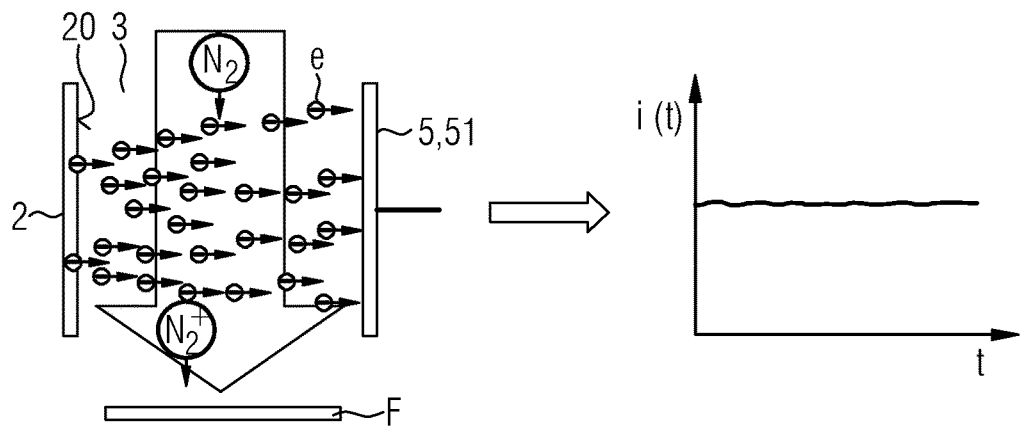
Figure 5:
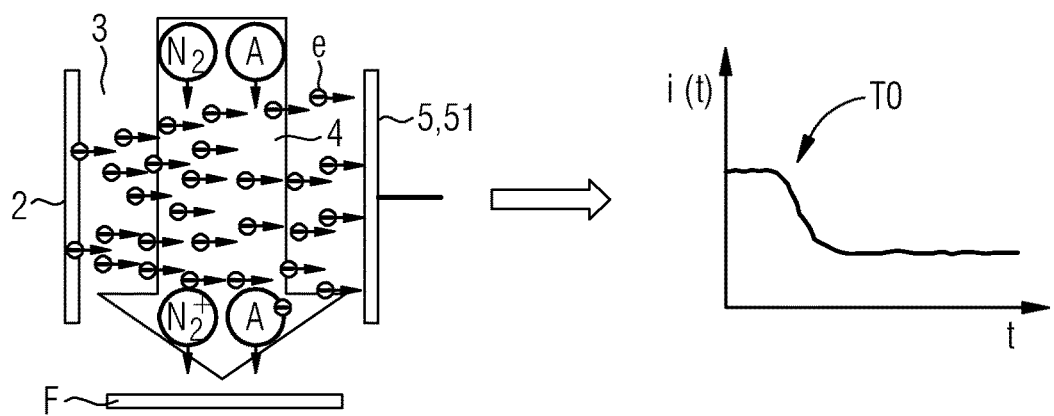

FIGS. 4 and 5 show a possible setup of a plane-parallel ECD with an ionization source 2, which is realized as a GIS-EE layer stack. Thus, the emission side 20 and the electron detector 5, 51 are oriented parallel to each other, similar to a plate capacitor. The emitted electrons e are guided by the electric field F through the gas flow 4 towards the electron capture device 5, 51.

The probability of electron capture determines the sensitivity of the measurement and is increased by a field-free space. However, the low-energy electrons emitted by the GIS-EE 2, which have a kinetic energy in the range of, for example, up to 50 eV, penetrate, for example, only a few 10 nm to about 10 µm into air at normal pressure. Therefore, preferably, the electrons e are first transported away from the emission side 20, which can be achieved by pulsed operation: During electron capture, no voltage is applied between the emission side 20 and the electron detector 5, 51 to favor electron capture. In this case, the ions formed are carried away by the gas flow. During a voltage pulse, the emitted electrons e can be distributed in the sample chamber 3 on the one hand and the number of electrons e still present can be measured at the same time. In the presence of an analyte A, the current difference would then be a measure of the concentration, see in particular FIG. 5, right-hand side. Pulses refer to periodic signals with optionally variable amplitude, frequency, signal shape and/or pulse width.

Alternatively, additional gas flows can be used to guide the gas flow to be analyzed closer to the GIS-EE surface through a suitable flow via the ratio of the flows.

It is possible to operate the ionization detector 1, designed as an ECD, in pulsed mode and to control it to a constant average current by varying the pulse frequency. In this way, the pulse frequency becomes a direct measure of the concentration of the analyte A and is still linear over several orders of magnitude. The gas flow can be either perpendicular to the readout voltage or parallel through one or more holes in the anode 51 or also in the GIS-EE 2, see also FIG. 6. Thus the gas inlet 56 is combined with the electron detector 51. For example, in extension of the emission side 20, the gas outlet 55 is located. Optionally, there may be a heater 54 extending, for example, transversely to the emission side 20, which can limit the sample chamber 3 in the direction perpendicular to the emission side 20. The heater can prevent condensation of the analyzed fluid.

Alternatively, two perpendicular electric fields F with different strengths can be used in serial pulsed operation. In a first voltage pulse, the electrons are distributed into the sample chamber 3, and with a second voltage pulse the electrons e remaining in sample chamber 3 are measured.

Figure 7:
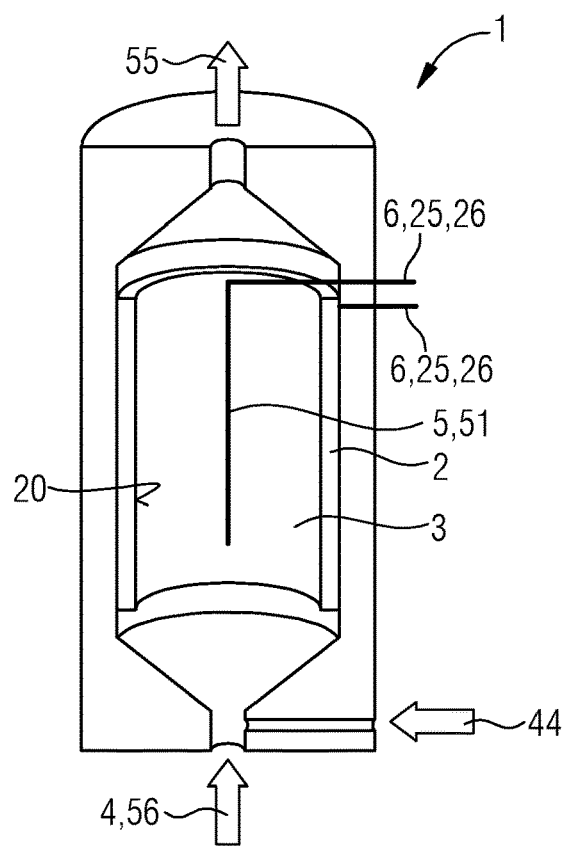

FIG. 7 shows a possible radial structure of the ionization detector 1. Here, the GIS-EE 2 can be designed as a foil, for example, with a flexible graphite substrate 21. This means that the GIS-EE 2 radially surrounds the sample chamber 3 and the central, pin-shaped electron detector 51 and is shaped like a cylinder jacket. The gas 4 can be fed axially through the sample chamber 3 by means of the openings 56, 55. Optionally, a further inlet for an additional purge gas 44 is provided, for example, to reduce the residence time of an analyte A in the sample chamber 3 and thus to reduce back-mixing of the sample. Furthermore, electrical connection lines 6, 25, 26 can be supplied from the outside so that the ionization detector 1 can be efficiently electrically contacted with a plug, for example.

The operation of the ionization detector 1 can be realized pulsed, as in the plate condenser concept. In addition, it is possible to design the GIS-EE 2 with holes or as a grid and to guide the gas flow radially through the GIS-EE 2 and/or to have the gas outlet on the axis of rotation.

The radial structure as shown in FIG. 7 can be applied analogously to all other embodiments, which are drawn as plate capacitors, for example.

In all other respects, the comments on FIGS. 1 to 3 apply in the same way to FIGS. 4 to 7, and vice versa.

By using the GIS-EE 2, the ionization detector 1 can be implemented as a mass spectrometer, MS for short, see FIGS. 8 and 9. Thus, an MS can be implemented by the GIS-EE 2 as a MEMS device, where MEMS stands for micro-electromechanical system. A low airflow can be realized by the gas inlet 56 having dimensions in the µm range. For example, the at least one gas inlet 56 has an average diameter of at least 0.1 µm or of at least 0.2 µm and/or of at most 1 cm or of at most 1 mm or of at most 0.1 mm or of at most 10 µm.

By ionization with a GIS-EE 2 directly in the channel of the sample chamber 3, or preferably with a plurality of such channels, an ionized air flow can be achieved. Preferably, the length and volume of the sample chamber 3 are such that very high ionization rates are achieved. By means of a zone with a strong electric field, the ions i could be trapped at specific locations, for example, implanted in a target metal.

Deviating from the illustration in FIGS. 8 and 9, several stages of such ionization zones and implantation zones can also be connected in series. Ions i could be extracted from them in a pulsed manner by a high electric field and spectrometrically sorted and/or measured according to their mass by a time-of-flight measurement. To achieve high sensitivity, a multichannel plate with electron amplification can also be used for readout. An additional unit can also be used for evacuation. This could also be carried out by a micro-ion getter pump, for example, as described in document PL 228 498 B1. The disclosure content of this document with respect to the pump is incorporated by reference.

For example, the channels shown extending from the gas inlet 56 in the ionization detector 1 have an edge length or diameter of an entrance opening of 100 nm to 100 µm and/or a length of 100 µm to 10 cm. The channels may extend into the ionization detector 1 with a constant cross-section or with a varying cross-section. These channels can also be meander-shaped in order to realize a sufficiently low flow rate with compact dimensions. These channels can also be designed as an array with multiple openings. For example, an evacuation stage has a side length of 100 µm to 10 cm. A column length of the time-of-flight mass spectrometer, in the direction away from the gas inlet 56, is, for example, at least 1 mm and/or at most 3 m or at most 50 cm.

Optionally, a gas outlet 55 is provided, which may be located in the area of the time-of-flight mass spectrometer or elsewhere, see FIG. 9, and may be used for a MEMS ion getter pump, for example.

In all other respects, the comments on FIGS. 1 to 7 apply in the same way to FIGS. 8 and 9, and vice versa.

In FIGS. 10, 11, 12 and 13, it is shown that the GIS-EE 2 is lattice-shaped so that a plurality of holes 42 pass through the substrate 21, the insulator layer 22 and the gate electrode 23, and the optional protective layer 24 may also be present, not drawn. In this regard, the insulator layer 22 and the gate electrode 23, as well as the optional protective layer 24, may be located either only on side surfaces of the holes 42, or only on sides of the substrate 2 facing the measuring unit 5, or both. It is possible that the measuring unit 5 is also designed as a grid and is or comprises, for example, an accelerating electrode 52. A control electronics 7 is drawn only schematically in a highly simplified manner.

Figure 11:
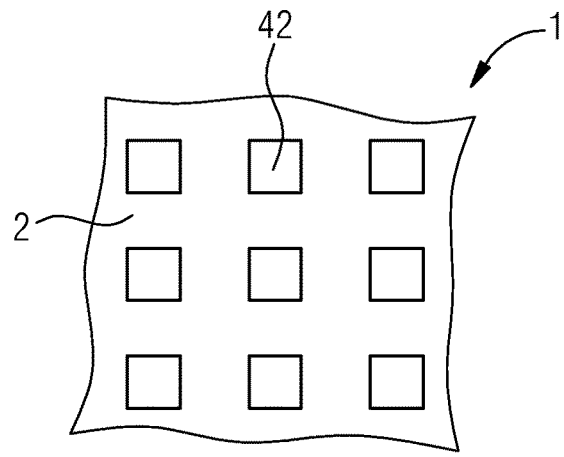
FIGS. 11 and 12 show schematic top views according to embodiments of ionization detectors.
Figure 12:
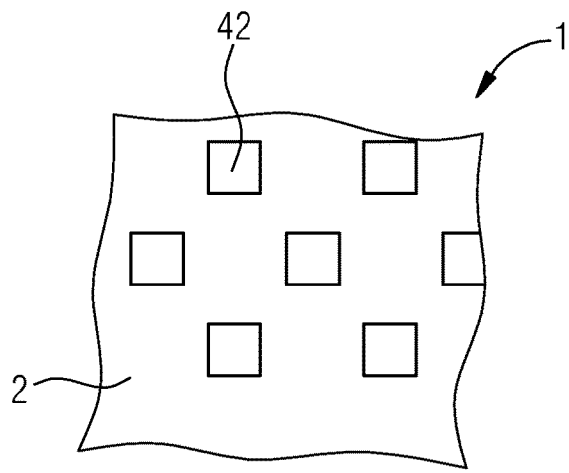
Figure 13:
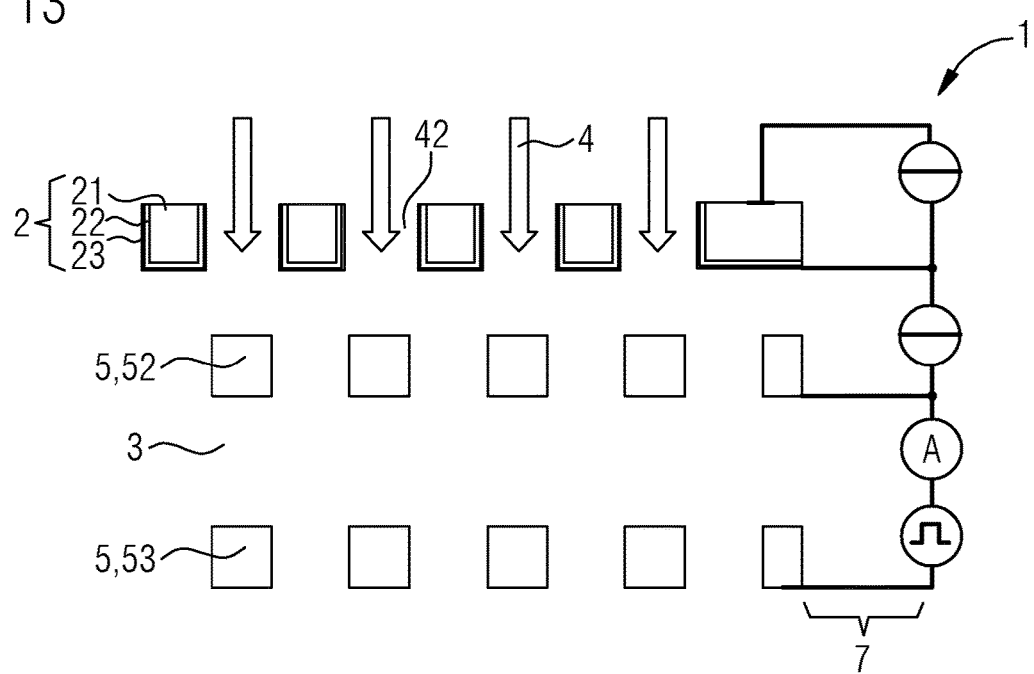
FIGS. 13 to 15 show schematic sectional views of detection methods according to embodiments of ionization detectors.

According to FIG. 11, the holes 42 are placed in a regular rectangular grid. The holes 42 can be not only square, but also rectangular, round or otherwise shaped. Alternatively, other grid types are possible, for example, hexagonal grid arrangements of the holes can be realized, see FIG. 12. Furthermore, it is possible that configurations with a stepped structure are chosen, see FIG. 13, so that, for example, an accelerating electrode 52 can be combined with a mass spectrometer unit 53. The arrangement of the electrodes can match the GIS-EE structure with respect to period length and alignment or be de-aligned to it and/or have different period lengths. In particular, the period length denotes a lateral distance between the grating apertures, also referred to as pitch, plus a diameter of the grating apertures.

The ionization detectors 1 of FIGS. 10 to 13 can also be operated in pulsed mode to realize a field-free mode, as well as a withdrawal of the electrons from the emission side 20 together with a current measurement. It is also possible that the emitted electrons with the energy of >0 eV to 50 eV are transported with the gas flow without external electric field. Thus, a response in the field-free region along the flow direction is possible. The possibly pulsed readout structure can also be connected downstream in this case. It is also possible to use a stack of several such structures to increase the sensitivity of the measurement.

In all other respects, the comments on FIGS. 1 to 9 apply in the same way to FIGS. 10 to 13, and vice versa.

Figure 14:
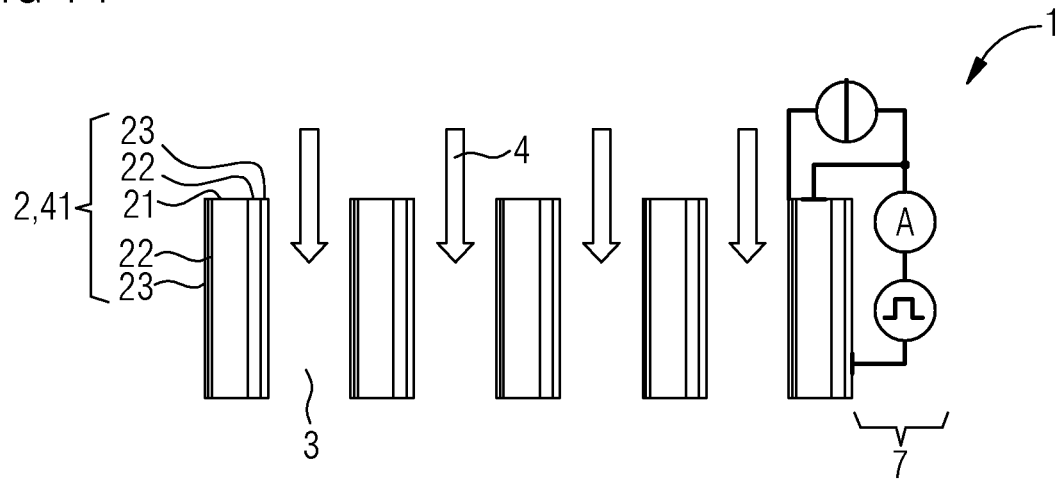
Figure 15:
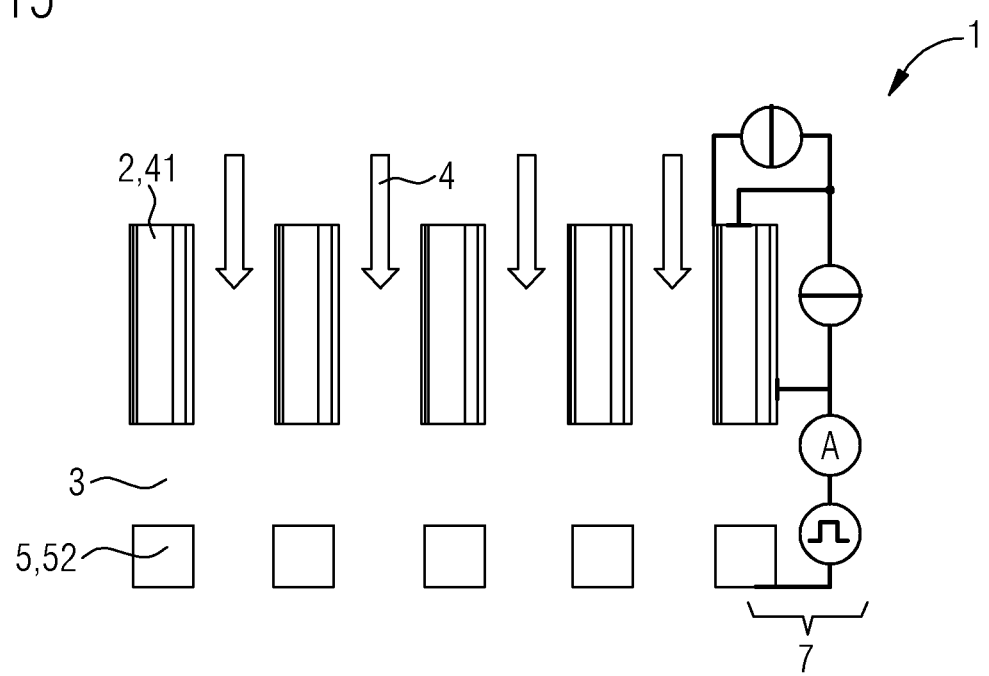

FIGS. 14 and 15 show ionization detectors 1 in which the GIS-EE 2 is in the form of lamellae 41. The lamellae 41 are arranged in a common plane, for example, and main sides of the lamellae 41 may be oriented perpendicular to this common plane.

In this case, the GIS-Es 2 can each be applied to one or both sides of the lamellae 41. Due to the transport of the electrons with the gas flow, the readout structure can be connected downstream again or, as described above, can be carried out directly in the lamellae, whereby pulsed or DC operation is possible. Again, a stack of several such zones is possible. In pulsed operation, a field-free area can also be temporarily realized between the lamellae 41 and the ions formed by electron capture can be removed. An ECD can thus be realized by a downstream readout.

One side of the lamellae 41 can also be insulating. In this case, ions can first accumulate there and build up an opposing electrical field so that the ionized analytes are not discharged at a rear-side lamella wall. Also, a conductive connection to ground potential as well as to positive or negative voltages is then possible. Thus, also, by an equal potential of the backside electrode and the gate electrode as well as a negative voltage of the substrate electrode, a constant field-free area or nearly field-free area between the lamellae 41 can be achieved. The same is possible in all other examples.

A distance between adjacent lamellae 41 is, for example, at least 0.1 µm or at least 1 µm and/or at most 1 cm or at most 0.1 mm or at most 10 µm or at most 1 µm or at most 0.1 µm; in particular, the distance is at most ten times or four times or twice as great as a mean penetration depth of the electrodes into the fluid mixture. The same preferably applies to a distance between the emission side 20 and the electron detector 51, see, for example, FIGS. 4 to 7.

In all other respects, the comments on FIGS. 1 to 13 apply in the same way to FIGS. 14 and 15, and vice versa.

Figure 16:
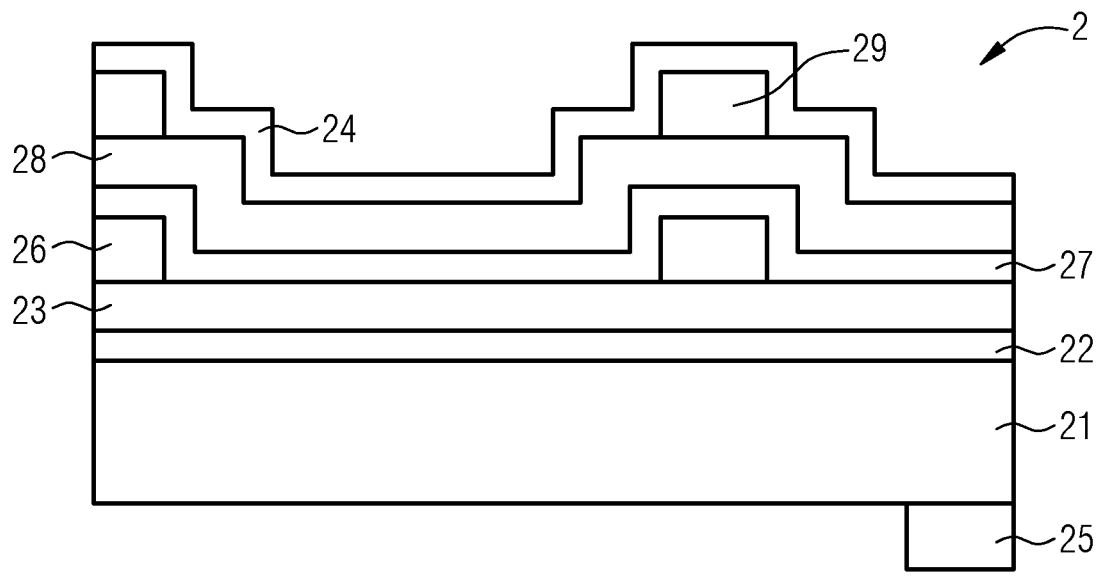
FIGS. 16 to 18 show schematic cross-sectional views according to embodiments of ionization detectors.
Figure 17:
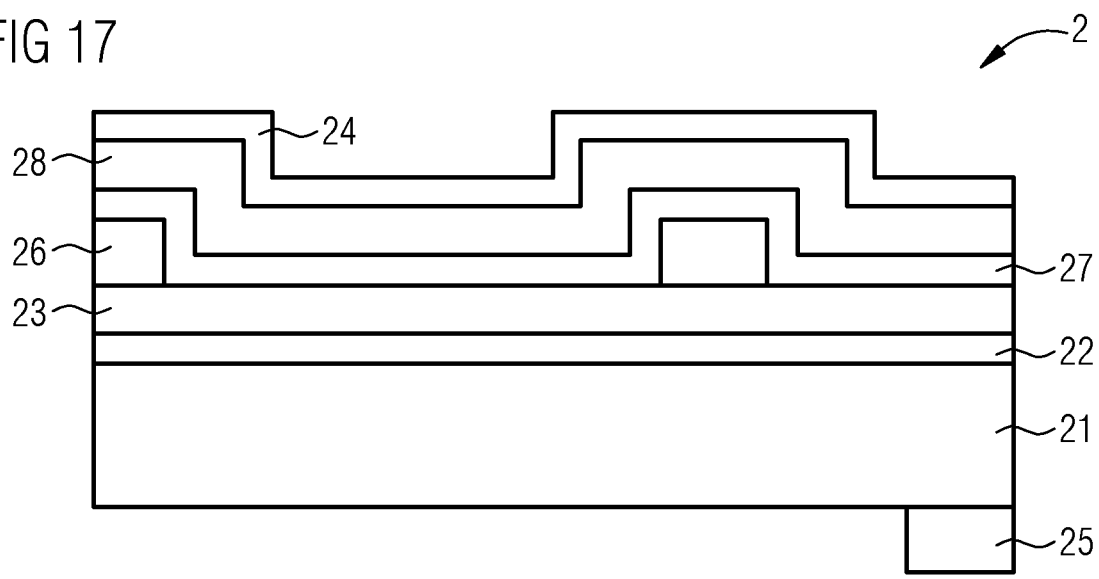
Figure 18:
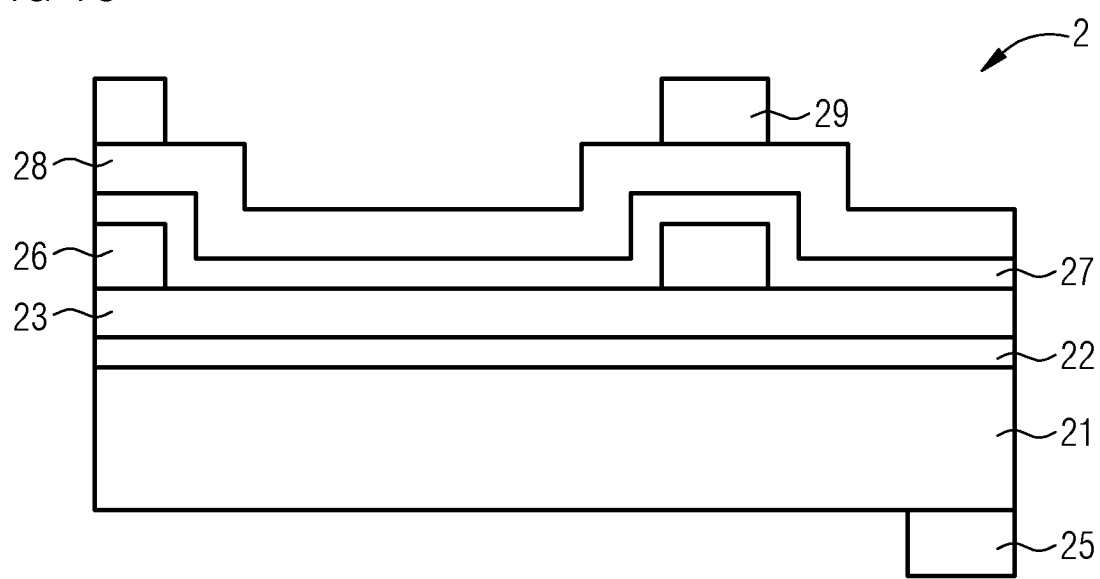

In the examples of FIGS. 16 to 18, further layers are applied to the GIS-EE structure, as shown, for example, in FIG. 1, so that a stacked arrangement is realized. The layers 21, 22, 23 of the GIS-EE 2 are thereby constructed, for example, as explained in connection with FIG. 1.

Thus, a further insulator layer 27 is provided directly on the gate electrode 23. The further insulator layer 27 has, for example, a thickness of at least 2 nm and/or of at most 50 nm. The further insulator layer 27 is, for example, made of an oxide, such as $SiO_2$, or of a nitride, such as hBN. The further insulator layer 27 may cover part or all of the gate electrode 23.

An energy control electrode 28 is applied directly to the further insulator layer 27, for example, over its entire surface. The energy control electrode 28 can partially cover the further insulator layer 27 or cover the entire surface. For example, the energy control electrode 28 is made of graphene.

By means of the energy control electrode 28, an energy of the electrons emitted from the GIS-EE 2 can be adjusted and varied.

In FIGS. 16 and 17, it is shown that further the optional protective layer 24 is provided. According to FIG. 16, a third electrical connection structure 29, with which the energy control electrode 28 is electrically controlled, is thereby provided between the protective layer 24 and the energy control electrode 28. Like the second electrical connection structure 26, the third electrical connection structure 29 may be implemented by a plurality of contact paths, such as an electrical contact grid.

The second and third electrical connection structures 26, 29 can be applied congruently one above the other. For example, the second electrical connection structure 26 is applied directly between the gate electrode 23 and the further insulator layer 27. The second electrical connection structure 26 and thus also the further insulator layer 27 can rise above the gate electrode 23. The same applies to the energy control electrode 28 and the third electrical connection structure 29.

In all other respects, the comments on FIGS. 1 to 16 apply in the same way to FIGS. 16 to 18, and vice versa.

In the above examples, the ionization detector 1 is configured as an ECD and/or as an MS. Likewise, it is possible in each case for the ionization detector 1 to comprise an electron photoionization detector, also referred to as an ePID, or to be an ePID.

In a conventional photoionization detector, PID, the aim is to achieve direct ionization of the analyte, particularly a gaseous analyte, by excitation with UV radiation with a photon energy of at most 15 eV, without ionizing the carrier gas, which is usually nitrogen or air. In addition, the ionization energy can be used to increase selectivity by means of a tunable electron source, such as the GIS-EE 2 used here.

Figure 6:
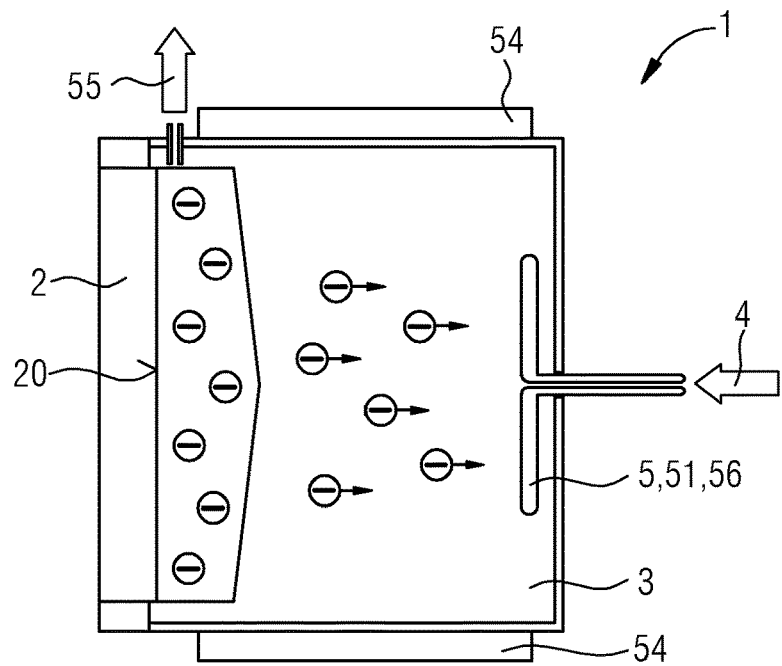

One possibility is a design as a simple plate capacitor, analogous to FIGS. 4 to 6, or also a design as a cylindrical capacitor, analogous to FIG. 7, composed of the GIS-EE 2 and an anode of the measuring unit 5. If the electron energy is varied through, for example, by varying the control voltage at the GIS-EE 2, or if there is also a switchover to different GIS-EEs 2 with different insulator thicknesses and thus different emission energies, the current in the capacitor depends on the number of ions formed and can thus enable a concentration measurement based on the ionization energy.

For this purpose, the energy dependence of the electron penetration depth and the influence on the current must preferably be calibrated without the presence of analytes. Alternatively, differential measurements are performed with two ePIDs, one with sample gas and one with reference gas. Again, a GIS-EE 2 with openings is conceivable, possibly designed as a grid, see FIGS. 10 to 15. The configurations of FIGS. 10 to 15 can thus also be used as an ePID, where ionization is performed in the GIS grid part with different electron energies and the current can be measured either to the anode or in another electrode pair. Such a setup can compensate for the low penetration depth of the electrons especially with small openings in the grid, that is, with a large aspect ratio, and still provide for a high degree of ionization.

Such a setup is especially possible as a stack of several cells to increase the sensitivity of the measurement, as also possible in all other examples. It is also possible to use different energies of the emitted electrons in this case to measure different ionization energies in parallel. In the lamellar structure of FIGS. 14 and 15 as an ePID, it is also possible to use individual lamellae 41 for different electron energies.

Further, the ionization detectors 1 described herein may comprise or be an ion mobility spectrometer, or IMS. In an IMS, ionization is typically performed in an ionization chamber using a radioactive $^{63}$Ni foil. If air is present in the ionization chamber, nitrogen ions are mainly formed. Substances in the air are then ionized by chemical gas phase reactions to form so-called reactant ions, which can be positive or negative. By pulsed extraction of the ions and propagation in a drift tube, a signal can be generated depending on the ion mobility.

With the ionization detector 1 described here, the otherwise necessary radioactive $^{63}$Ni foil can be replaced by the GIS-EE 2. Here again, a plate capacitor design, analogous to FIGS. 4 to 6, or a cylindrical design, analogous to FIG. 7, is possible. The low penetration depth of the electrons in air can be compensated by external electric fields for a withdrawal of the electrons or also ions, whereby again a dynamic or pulsed operation is possible. Here again a GIS-EE 2 with holes 42 or a lamellar structure is possible. A grid-like structure as well as the lamellar structure from FIGS. 10 to 15 or also multiple stacks of both variants can thus also be used as an ion source for the IMS.

Such grid-like structures or lamellar structures can be aligned perpendicular to a drift tube, for example, the electrons and/or ions can be drawn off into the drift tube in a pulsed manner. A gas flow in the direction of the drift tube, with a lateral exit directly in front of the drift tube, can also be realized. In this case, electrically pulsed packets can be drawn into the drift tube from the ions present.

Furthermore, with a GIS-EE 2 it is possible to generate very localized ions and thus easily solve the problem of ion focusing in FAIMS, field asymmetric waveform ion mobility spectrometry, and A-IMS, aspiration ion mobility spectrometers, without using fluidic focusing structures. Furthermore, local modulation of the electrons and/or ions is also possible by individually drivable GIS-EE units, as well as temporal modulation.

Finally, the ionization detectors 1 described here can be designed as combination detectors. For example, several properties can be measured simultaneously to realize a very compact detector with high selectivity.

In particular, one of the ePIDs described further above can be used and a drift tube can be added downstream to determine ion mobility in addition to ionization energy.

It is also possible, for example, to apply a constant high electric field in a plate capacitor geometry, vary the electron energy and then measure the current. In this case, the current depends on the concentration of substances with a sufficiently small ionization energy and, since the ionization takes place in a very small region around the GIS-EE 2, on a diffusion constant, that is, the ion mobility, during ionization with varied electron energy. This also allows a distinction to be made between diffusion constant and ionization energy. By a pulsed operation with varied pulse frequency it may be possible to distinguish the concentration and diffusion constant for a given ionization energy.

In such a detector, a distinction could first be made between electrons and generated ions. This can be realized, for example, by polarity, a temporal separation due to the different mobility as well as by a gas flow, which transports ions away.

With a negatively poled anode, the electrons as well as negative ions generated by electron capture can be discharged through the gate electrode. If the energy is sufficient and positive ions are generated by impact ionization, these can be measured at the anode and thus the proportion of positive ions can be determined. Conversely, electrons are measurable at a positively charged anode, as are negative ions generated by electron capture or chemical gas phase ionization. Likewise, additional electrons generated by electron impact ionization would contribute to this current and thus lead to an increase in the anode current. Positive ions can therefore also be measured indirectly in the latter case.

The separation of reaction products due to electron collisions over time can be implemented, for example, by a pulse operation. Here, the electrons would be measurable directly at the anode due to the much greater mobility and the ions only after a time delay. This means that with a time-resolved current measurement a distinction is possible. Due to the small penetration depth and the diffusion process, a differentiation of different ions is also possible. Furthermore, the excitation could also be sinusoidal and the anode current could be measured in magnitude and phase. Still another degree of freedom is possible by excitation with a sinusoidal sweep, where the frequency would be swept. The current signal would then depend on electron drift and ion drift as well as the lifetime of the ions.

Alternatively, the ions could be transported away with the gas flow. In this case, the measurable current decreases because fewer electrons are present, similar to the ECD. In this case, the pulse frequency could also be controlled to a constant current and the ionic fraction could be determined. In this case, however, positive and negative ions would be measured together. By an additional readout structure, such as a plate capacitor with a constant potential difference and analysis of the currents at one of the plates in the outlet, a distinction could nevertheless be realized. Furthermore, a structure could be realized which makes a local resolution of the current components measurable and thus also makes a differentiation of the ions possible due to the different mobility which causes different trajectories of the ions.

Both effects can also be combined, either in one structure or also in cells connected in series.

The possibility of varying the temporal emission as well as the gas flow and the ionization energy thus makes a compact detector possible. If the electron energy is varied, an increase in the ionic fraction would be observed by exceeding the ionization energy of a component of the gas mixture, which is proportional to the amount of molecules or atoms in the gas mixture affected by ionization.

Another possibility is to adjust the gas flow and thus influence the diffusion. Here, either the gas flow could be switched off for the measurement or different gas flows could be compared with each other.

Such a detector can be calibrated with known mixtures of substances and then used for detection of unknown substances and mixtures of substances to determine properties such as electron affinity, drift constant and/or ion mobility.

At electron energies above about 15.6 eV, gas phase ionization is also possible, similar to the IMS, which is again based on other properties and thus provides a further means of distinguishing between constituents of the gas mixture.

In particular, such a type of detector is made possible by an electron source that provides precise electron energy tuning with a sufficiently narrow band energy spectrum as well as temporal control over the emission. Such a type of detector is thus made possible in particular by the use of the GIS-EE described here.

All of the examples described herein can also be more easily implemented by the GIS-EE 2 as an integrated MEMS device, similar to the MEMS MS shown in FIGS. 8 and 9.

Furthermore, in all of the examples, a metal grid is also possible for the GIS-EE 2 to minimize the voltage drop across the gate electrode 21 for larger areas, see in particular the second electrical connection structure 26 in FIG. 1. In each case, an array of multiple GIS-EE 2 is also possible to implement a larger overall area.

The dimensions of the listed setups for the ionization detectors 1, which can be designed as ECD, ePID, IMS or as combination detectors, are, for example, as follows, individually or in combination:

plane-parallel or cylindrical capacitor-like setup: side length 100 μm to 10 cm;

grid setups: openings of the holes 100 nm to 1 cm, side length of a total grid surface seen in plan view 100 μm to 10 cm, thickness of the grid 1 μm to 1 mm, spacing of the grids and the electrodes from each other 10 μm to 10 cm;

lamellar structures: lamella spacing 100 nm to 1 cm, area of lamellae in total 100 μm×100 μm to 10 cm×10 cm, spacing of electrodes and lamellae from each other 10 μm to 10 cm.

Thus, the ionization detectors 1 can be designed as portable handheld devices. This means, for example, a size similar to a cordless screwdriver.

The invention described herein is not limited by the description based on the embodiments. Rather, the invention encompasses any new feature as well as any combination of features, which in particular includes any combination of features in the patent claims, even if this feature or combination itself is not explicitly stated in the patent claims or embodiments.

The contents of this application have been created at KETEK GmbH, Munich, Germany, at the University of the Federal Armed Forces Munich and at Leibniz University Hannover.

What is claimed is:

1. An ionization detector comprising:
   a gate-insulator-substrate electron-emission structure (GIS-EE) configured to emit low-energy electrons;
   a sample chamber configured for at least one gas to be detected, the sample chamber being adjacent to the GIS-EE; and
   a measuring unit configured to detect and/or select charged particles, wherein the charged particles are due to the emitted electrons and/or comprise the emitted electrons,
   wherein the GIS-EE comprises:
      an electrically conductive substrate,
      a transfer layer of a material with a band gap of at least 4 eV located on the substrate,
      a gate electrode of a further electrically conductive material located directly on the transfer layer,
      a first electrical connection structure located on the substrate, and
      a second electrical connection structure located on the gate electrode.

2. The ionization detector according to claim 1, wherein the GIS-EE is configured to emit the electrons with a kinetic energy up to 50 eV directly into the at least one gas to be detected.

3. The ionization detector according to claim 1, wherein the GIS-EE is configured to emit hot electrons as the low-energy electrons after a field emission process into a conduction band of the transfer layer and a minimization of scattering.

4. The ionization detector according to claim 1, wherein the gate electrode comprises carbon and has a thickness of at most 20 nm.

5. The ionization detector according to claim 1, wherein the substrate is of silicon, the transfer layer is of hBN, and the gate electrode is of graphene.

6. The ionization detector according to claim 1, wherein the GIS-EE comprises a plurality of lamellae, each lamellae configured to emit the electrons.

7. The ionization detector according to claim 6, wherein each of the lamellae comprises a sub-area of a gate electrode, and wherein the sub-areas are aligned parallel to each other and are each adjacent to the sample chamber.

8. The ionization detector according to claim 1, wherein the GIS-EE is traversed by a plurality of holes and the sample chamber comprises the holes.

9. The ionization detector according to claim 1, wherein the sample chamber is radially surrounded by the GIS-EE.

10. The ionization detector according to claim 1, further comprising:
an electron capture detector,
wherein the measuring unit comprises an electron detector facing an emission side of the GIS-EE,
wherein the measuring unit is configured to generate an electric field between the emission side and the electron detector, and
wherein the sample chamber is configured to allow the at least one gas to be detected to flow between the emission side and the electron detector.

11. The ionization detector according to claim 1, further comprising:
an ion mobility spectrometer,
wherein the measuring unit comprises at least one accelerating electrode configured to accelerate the charged particles.

12. The ionization detector according to claim 1, wherein the measurement unit further comprises a mass spectrometer comprising the GIS-EE.

13. A method for operating the ionization detector according to claim 1, the method comprising:
emitting, by the GIS-EE, the low-energy electrons;
guiding the at least one gas to be detected into the sample chamber; and
detecting and/or selecting, by the measuring unit, the charged particles.

14. An ionization detector comprising:
a gate-insulator-substrate electron-emission structure (GIS-EE) configured to emit low-energy electrons;
a sample chamber configured for at least one gas to be detected, the sample chamber being adjacent to the GIS-EE; and
a measuring unit configured to detect and/or select charged particles, wherein the charged particles are due to the emitted electrons and/or comprise the emitted electrons,
wherein the GIS-EE comprises:
an electrically conductive substrate,
a transfer layer of a material with a band gap of at least 4 eV located on the substrate,
a gate electrode of a further electrically conductive material located directly on the transfer layer,
a first electrical connection structure arranged on the substrate, and
a second electrical connection structure arranged on the gate electrode, and
wherein at least one of the GIS-EE comprises a plurality of lamellae, each configured to emit the electrons, or
wherein the GIS-EE is traversed by a plurality of holes and the sample chamber comprises the holes.

15. An ionization detector comprising:
a gate-insulator-substrate electron-emission structure (GIS-EE) configured to emit low-energy electrons;
a sample chamber configured for at least one gas to be detected, the sample chamber being adjacent to the GIS-EE;
a measuring unit configured to detect and/or select charged particles, wherein the charged particles are due to the emitted electrons and/or comprise the emitted electrons; and
an electron ionization detector,
wherein the GIS-EE is configured to vary an energy of the emitted electrons.

16. The ionization detector according to claim 15, wherein the measuring unit is configured to detect a number and/or a type of generated electrically charged particles depending on the energy of the emitted electrons.

17. The ionization detector according to claim 16, wherein the ionization detector is configured to determine an ionization energy of the at least one gas and/or an ionization rate of the at least one gas.

18. An ionization detector comprising:
a gate-insulator-substrate electron-emission structure (GIS-EE) configured to emit low-energy electrons;
a sample chamber configured for at least one gas to be detected, the sample chamber being adjacent to the GIS-EE; and
a measuring unit configured to detect and/or select charged particles,
wherein the charged particles are due to the emitted electrons and/or comprise the emitted electrons, and
wherein the GIS-EE further comprises a further gate-insulator layer sequence to adjust an energy of the emitted electrons by an additional potential.

19. The ionization detector according to claim 18, wherein the GIS-EE comprises the following layers in the order indicated and in direct sequence: a substrate, a transfer layer, a gate electrode, a further insulator, or an energy control electrode.

* * * * *